US012785037B2

(12) United States Patent
Chen et al.

(10) Patent No.: US 12,785,037 B2
(45) Date of Patent: Nov. 3, 2026

(54) PASSIVATION EQUIPMENT AND PASSIVATION METHOD FOR SEMICONDUCTOR DEVICE

(71) Applicant: Tokyo Electron Limited, Tokyo (JP)

(72) Inventors: Chi-Wen Chen, Hsinchu City (TW); Chun-Huai Li, Hsinchu City (TW); Chih-Hung Chen, Hsinchu City (TW); Chun-Hung Hung, Hsinchu City (TW)

(73) Assignee: Tokyo Electron Limited, Tokyo (JP)

( * ) Notice: Subject to any disclaimer, the term of this patent is extended or adjusted under 35 U.S.C. 154(b) by 447 days.

(21) Appl. No.: 18/505,133

(22) Filed: Nov. 9, 2023

(65) Prior Publication Data

US 2024/0162003 A1 May 16, 2024

(30) Foreign Application Priority Data

Nov. 11, 2022 (TW) ................................. 111143106

(51) Int. Cl.
*H01J 37/32* (2006.01)

(52) U.S. Cl.
CPC .. *H01J 37/32073* (2013.01); *H01J 37/32348* (2013.01); *H01J 37/3244* (2013.01); *H01J 37/32458* (2013.01); *H01J 37/32981* (2013.01); *H01J 2237/327* (2013.01); *H01J 2237/332* (2013.01)

(58) Field of Classification Search
CPC ........... H01J 37/32073; H01J 37/32348; H01J 37/3244; H01J 37/32458; H01J 37/32981; H01J 2237/327; H01J 2237/332
See application file for complete search history.

(56) References Cited

U.S. PATENT DOCUMENTS

| | | | | |
|---|---|---|---|---|
| 5,554,223 A * | 9/1996 | Imahashi | H01J 37/321 | 156/345.48 |
| 5,571,366 A * | 11/1996 | Ishii | H01J 37/32082 | 216/60 |
| 5,685,949 A | 11/1997 | Yashima | | |
| 5,988,104 A * | 11/1999 | Nambu | H01J 37/32238 | 118/723 ME |
| 6,841,342 B2 * | 1/2005 | Nishi | G03F 7/38 | 438/758 |
| 6,863,020 B2 * | 3/2005 | Mitrovic | H01J 37/32568 | 156/345.43 |
| 7,316,761 B2 * | 1/2008 | Doan | H01J 37/32541 | 156/345.43 |
| 7,446,052 B2 * | 11/2008 | Sugawara | H10P 14/662 | 438/770 |

(Continued)

FOREIGN PATENT DOCUMENTS

| | | |
|---|---|---|
| CN | 1777347 A | 5/2006 |
| TW | M641701 U | 6/2023 |

*Primary Examiner* — Craig M Schneider
*Assistant Examiner* — Christopher D Ballman
(74) *Attorney, Agent, or Firm* — IPUSA, PLLC

(57) ABSTRACT

A passivation equipment includes a chamber housing and a splitter disposed in the chamber housing. The splitter divides the chamber housing into a first chamber and a second chamber, where the second chamber accommodates a semiconductor device. The passivation equipment further includes a first intake tube connected to the first chamber to insert a reacting gas, a plasma producing unit disposed in the first chamber, and a pressure detecting unit connected to the first chamber.

19 Claims, 4 Drawing Sheets

100

(56) References Cited

U.S. PATENT DOCUMENTS 7,537,672 B1 * 5/2009 Koshiishi ............ H01J 37/3255
156/345.47
7,661,388 B2 * 2/2010 Schmitt ............ H01J 37/32192
118/723 E
9,524,847 B2 * 12/2016 Wada ...................... H01J 37/04
10,692,704 B2 * 6/2020 Louis ................... B01J 19/1887
11,069,510 B2 * 7/2021 Um .................. H01J 37/32082
11,901,179 B2 * 2/2024 Tolle ................. H01J 37/32899
12,006,572 B2 * 6/2024 Lin ................... C23C 16/45565
12,183,583 B2 * 12/2024 Ventzek ........... H01J 37/32146
2009/0221149 A1 * 9/2009 Hammond, IV .. H01J 37/32449
156/345.33
2010/0275846 A1 * 11/2010 Kitagawa ................ A61P 31/04
118/723 AN
2011/0104395 A1 * 5/2011 Kumagai .............. C23C 16/402
118/725
2011/0308453 A1 * 12/2011 Su ....................... H10P 72/0436
118/708
2012/0255492 A1 10/2012 Wu et al.
2013/0032085 A1 * 2/2013 Hanawa .............. C23C 16/4488
117/103
2013/0048606 A1 * 2/2013 Mao .......................... C23F 4/00
216/67
2014/0339980 A1 * 11/2014 Wu ..................... H01J 37/3233
315/5.13
2015/0179415 A1 * 6/2015 Sasaki ............... H01J 37/32651
156/345.1
2015/0280051 A1 * 10/2015 Xu ........................ H10F 71/138
438/98
2015/0348755 A1 * 12/2015 Han .................... H01J 37/3244
239/548
2016/0013022 A1 * 1/2016 Ayoub ............. H01J 37/32183
118/723 R
2016/0097123 A1 * 4/2016 Shugrue .............. C23C 16/4581
118/500
2016/0118225 A1 * 4/2016 Hayami .............. H01J 37/3244
156/345.29
2016/0203995 A1 * 7/2016 Kanarik ................ C23C 16/402
156/345.26
2016/0362813 A1 * 12/2016 Bao ................... C23C 16/45563
2017/0256415 A1 * 9/2017 Kim ...................... H10P 50/283
2017/0350688 A1 * 12/2017 Boyd, Jr. ........... G01B 9/02023
2019/0074163 A1 * 3/2019 Khaja ............... H01J 37/32082
2019/0198301 A1 * 6/2019 Ma .................... H01J 37/32899
2019/0271078 A1 * 9/2019 Raisanen ............ C23C 16/4407
2019/0304776 A1 * 10/2019 Choi ................... H10P 14/6336
2019/0348261 A1 * 11/2019 Lin ..................... H01J 37/3244
2020/0063262 A1 * 2/2020 Katou ................. H10P 14/6514
2020/0109472 A1 * 4/2020 Um ................... C23C 16/45536
2020/0381248 A1 * 12/2020 Sun ..................... H10P 14/6536
2021/0017648 A1 * 1/2021 Kubota ............. C23C 16/45523
2021/0183620 A1 * 6/2021 Tian .................. H01J 37/32091

* cited by examiner

PASSIVATION EQUIPMENT AND PASSIVATION METHOD FOR SEMICONDUCTOR DEVICE

RELATED APPLICATION

This application claims priority to Taiwan Application Serial Number 111143106, filed Nov. 11, 2022, which is herein incorporated by reference.

BACKGROUND

Field of Invention

The present invention relates to a passivation equipment and a passivation method for a semiconductor device. More particularly, the present invention relates to the passivation equipment and the passivation method for the semiconductor device by using plasma.

Description of Related Art

In a manufacturing process of a semiconductor device, a thin film deposition and a patterned etching process are common fabricating procedures in manufacturing a semiconductor component. However, in the aforementioned procedures, it is unavoidable to cause material defects, and the material defects are one of the important reason for affecting product yield and causing deterioration of electronic components. Against problems of the material defects, a passivation reaction is performed to improve property of the semiconductor component after the aforementioned fabricating procedures are completed in conventional process, which repair defects by introducing other elements to react and make bonds with defects in materials of semiconductor components.

Common conventional passivation reactions use furnace annealing process or plasma treatment at low temperature and low pressure. The furnace annealing process is performed by introducing hydrogen gas in a furnace with high temperature greater than 800° C., thereby performing annealing to the semiconductor components. However, due to limitation of thermal budget, the high-temperature furnace annealing cannot perform passivation repair for long time because of diffusion mechanism, or can destroy material of semiconductor components because of extremely high temperature. Moreover, most recent semiconductor components use dielectric material with high dielectric constant (high-k) as gate dielectric layer, and use metal gate electrode to replace traditional poly-Si material, that is, high-k metal gate (HKMG). Nevertheless, amounts of high-k dielectric material, such as hafnium oxide ($HfO_2$), can crystallize after high-temperature (great than 600° C., for example) annealing treatment, thereby causing the gate dielectric layer occur leakage. In other words, after forming the HKMG structure, the high-temperature passivation treatment cannot be performed. Besides, the passivation method by using plasma at low temperature and low pressure is usually performed by using plasma-enhanced chemical vapor deposition (PECVD), but the effect is not good, such that it can not further increase efficiency of the passivation reaction.

Based on above, it is needed to provide a passivation equipment and a passivation method for a semiconductor device to use high-pressure gas plasma and perform the passivation reaction for the semiconductor device efficiently.

SUMMARY

An aspect of the present invention provides a passivation equipment for a semiconductor device, which ionizes a reaction gas at a pressure not smaller than 1 atm by a plasma producing unit to produce high-pressure plasma.

Another aspect of the present invention provides a passivation method for a semiconductor device, which uses the passivation equipment of the above aspect to perform repairing operation to at least a semiconductor device.

According to the aspect of the present invention, providing the passivation equipment for the semiconductor device. The passivation equipment includes a chamber housing and a splitter disposed inside the chamber housing. The splitter divides the chamber housing into a first chamber and a second chamber, and the second chamber is configured to accommodate at least a semiconductor device. The passivation equipment further includes a first intake tube connected to the first chamber, a plasma producing unit disposed in the first chamber, and a pressure detecting unit connected to the first chamber. The first intake tube is configured to insert a reacting gas. The pressure detecting unit is configured to detect a pressure of the first chamber, in which the pressure is not smaller than 1 atm.

According to an embodiment of the present invention, the passivation equipment for the semiconductor device further includes a supporting unit disposed in the second chamber and a heating apparatus disposed in the second chamber and under the supporting unit. The supporting unit is configured to place the at least a semiconductor device. The heating apparatus is configured to heat the at least a semiconductor device.

According to an embodiment of the present invention, the passivation equipment for the semiconductor device further includes a carrying component disposed in the second chamber and plural heating apparatus disposed out of the chamber housing. The carrying component is configured to transport and place the at least a semiconductor device. The plural heating apparatus are configured to heat the at least a semiconductor device.

According to an embodiment of the present invention, the plasma producing unit uses a corona plasma source, and the plasma producing unit includes a high frequency pulse voltage source, a needle electrode and a plate electrode.

According to an embodiment of the present invention, the plasma producing unit uses a corona plasma source, and the plasma producing unit includes a high frequency pulse voltage source, a pillar electrode and a ring electrode.

According to an embodiment of the present invention, the plasma producing unit uses a dielectric barrier plasma source, and the plasma producing unit includes a high frequency pulse voltage source and two plate electrodes, in which at least one of the plate electrodes includes a dielectric barrier plate.

According to an embodiment of the present invention, the passivation equipment for the semiconductor device further includes a second intake tube connected to the first chamber and/or the second chamber. The second intake tube is configured to insert an inert gas.

According to an embodiment of the present invention, the passivation equipment for the semiconductor device further includes an exhaust pipe connected to the second chamber. The exhaust pipe is configured to exhaust the reacting gas.

According to the another aspect of the present invention, providing the passivation method for the semiconductor device. The passivation method includes providing a passivation equipment. The passivation equipment includes a chamber housing; a splitter disposed in the chamber housing, in which the splitter divides the chamber housing into a first chamber and a second chamber; a plasma producing unit disposed in the first chamber; a first intake tube connected to the first chamber; and a pressure detecting unit connected to the first chamber. The passivation method further includes placing at least a semiconductor device in the second chamber; inserting a reacting gas into the first chamber by the first intake tube to make a pressure of the first chamber not smaller than 1 atm; turning on the plasma producing unit to produce a high-pressure plasma; and performing a passivating operation, in which the passivating operation includes flowing the high-pressure plasma to the second chamber through the splitter and reacting with the at least a semiconductor device.

According to an embodiment of the present invention, the reacting gas comprises one or more of hydrogen gas ($H_2$), nitrogen gas ($N_2$), amine gas ($NH_3$), oxygen gas ($O_2$), water, hydrogen sulfide ($H_2S$), dinitrogen monoxide ($N_2O$), nitrogen dioxide ($NO_2$), phosphine ($PH_3$), arsine ($AsH_3$) and deuterium gas ($D_2$).

According to an embodiment of the present invention, when inserting the reacting gas, the method further includes inserting an inert gas to the first chamber and/or the second chamber. The inert gas includes one or more of helium, neon, argon, krypton and xenon.

According to an embodiment of the present invention, the passivation method further includes heating the at least a semiconductor device to 100° C. to 600° C. before turning on the plasma producing unit.

According to an embodiment of the present invention, the pressure of the first chamber is 1 atm to 100 atm.

According to an embodiment of the present invention, the pressure of the first chamber is greater than or equal to a pressure of the second chamber.

According to an embodiment of the present invention, the passivation method further includes applying an AC voltage to the plasma producing unit before turning on the plasma producing unit, in which a frequency of the AC voltage is lower than 13.6 MHz.

According to the aspect of the present invention, providing a passivation equipment for a semiconductor device. The passivation equipment includes a chamber housing and a splitter disposed inside the chamber housing. The splitter divides the chamber housing into a first chamber and a second chamber. A pressure of the first chamber is greater than or equal to 1 atm, and the second chamber is configured to accommodate at least a semiconductor device. The passivation equipment further includes a first intake tube connected to the first chamber, a second intake tube connected to the first chamber and the second chamber, a plasma producing unit disposed in the first chamber, and an exhaust pipe connected to the second chamber. The first intake tube is configured to insert a reacting gas. The second intake tube is configured to insert an inert gas. The exhaust pipe is configured to exhaust the reacting gas.

According to an embodiment of the present invention, the passivation equipment for the semiconductor device further includes a supporting unit disposed in the second chamber and a heating apparatus disposed in the second chamber and under the supporting unit. The supporting unit is configured to place the at least a semiconductor device. The heating apparatus is configured to heat the at least a semiconductor device.

According to an embodiment of the present invention, the passivation equipment for the semiconductor device further includes a carrying component disposed in the second chamber and plural heating apparatus disposed out of the chamber housing. The carrying component is configured to transport and place the at least a semiconductor device. The plural heating apparatus are configured to heat the at least a semiconductor device.

According to an embodiment of the present invention, the passivation equipment further includes a pressure detecting unit connected to the first chamber. The pressure detecting unit is configured to detect a pressure of the first chamber.

According to an embodiment of the present invention, the plasma producing unit uses a dielectric barrier plasma source or a corona plasma source.

Application of the passivation equipment and the passivation method for the semiconductor device uses high-pressure plasma to increase a concentration of free radical for passivation of the semiconductor device and decrease temperature of repairing process. Therefore, efficiency of repairing and passivation for the semiconductor device can be increased.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features can be arbitrarily increased or reduced for clarity of discussion.

DETAILED DESCRIPTION

Figure 1:
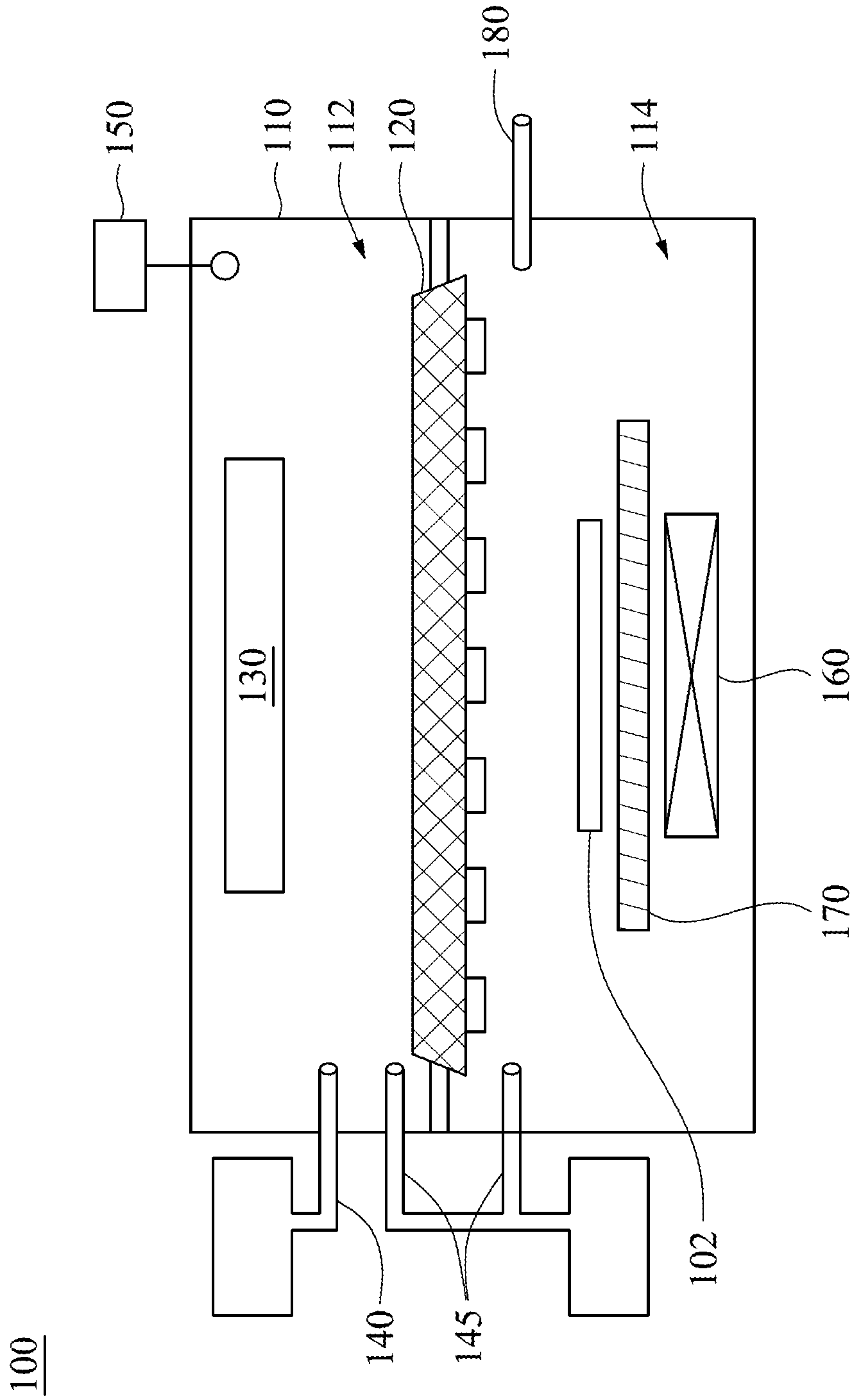
FIG. 1 illustrates a schematic diagram of a passivation equipment for a semiconductor device according to some embodiments of the present invention.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to above, the present invention provides the passivation equipment and the passivation method for the semiconductor device, which uses reacting gases at high pressure and in greater concentration to produce high-pressure plasma, thereby increasing a concentration of free radicals for passivation of the semiconductor device. Therefore, repairing material defects of the semiconductor devices can be performed at lower temperature, and efficiency of passivation for the semiconductor device can be increased.

Referring to FIG. 1, FIG. 1 illustrates a schematic diagram of a passivation equipment 100 for a semiconductor device according to some embodiments of the present invention. The passivation equipment 100 includes a chamber housing 110 and a splitter 120 disposed inside the chamber housing 110, and the splitter 120 divides a chamber to a first chamber 112 and a second chamber 114. In some embodiments, as shown in FIG. 1, the first chamber 112 is located over the second chamber 114. In other embodiments, the first chamber 112 is located beside the second chamber 114. The first chamber 112 is mainly used for a plasma producing chamber, while the second chamber 114 is used for process reaction chamber; thus, a semiconductor device 102 is placed within the second chamber 114. In some embodiments, the splitter 120 has a number of openings with the same or different size. The configuration of the splitter 120 helps free radical gas (described in the following) flow to respective location of the semiconductor device 102 in the second chamber 114 with homogeneous flux amount; thus, the passivation reaction can be performed homogeneously on the semiconductor device 102.

The passivation equipment 100 includes a first intake tube 140 connected to the first chamber 112. The first intake tube 140 is configured to insert reacting gas into the first chamber 112. In some embodiments, the reacting gas includes one or more of hydrogen gas ($H_2$), nitrogen gas ($N_2$), amine gas ($NH_3$), oxygen gas ($O_2$), water, hydrogen sulfide ($H_2S$), dinitrogen monoxide ($N_2O$), nitrogen dioxide ($NO_2$), phosphine ($PH_3$), arsine ($AsH_3$) and deuterium gas ($D_2$).

The passivation equipment 100 further includes a plasma producing unit 130 and a pressure detecting unit 150 located in the first chamber 112. When the aforementioned reacting gas is inserted into the first chamber 112, the pressure detecting unit 150 can detect pressure of the first chamber 112. When the pressure reaches 1 atm or greater than 1 atm, the plasma producing unit 130 is turned on to produce plasma gas. Volume recombination of the plasma gas and the reacting gas occurs, and neutral free radicals are produced. The free radicals diffuse into the second chamber 114 through the splitter 120 such that the semiconductor device 102 is soaked in a high-pressure gas with the neutral free radicals, thereby occurring the passivation reaction. Generally, the free radicals have greater reactivity, so passivation effect can be increased. As such, charged ions or charges contacting with the semiconductor device can be avoided, thereby decreasing problems that the charged ions accumulate on surface of the semiconductor device to cause electrostatic damage. In some embodiments, the plasma producing unit 130 uses methods of corona discharge or dielectric barrier discharge (DBD) to produce plasma. In a high-pressure environment, an applied voltage with very high frequency is difficult to produce stable plasma. Therefore, it is preferred that the frequency of the AC voltage applied by a voltage source is lower than 13.56 MHz. Moreover, compared to the conventional plasma process equipment, the passivation equipment 100 of the present invention doesn't apply radio frequency (RF) voltage, thereby preventing ionized charges or ions from damaging the semiconductor device.

In some embodiments, the first chamber 112 has a predetermined pressure not smaller than 1 atm, about 1 atm to about 100 atm is preferable, and greater than 1 atm to about 100 atm is more preferable. Since solubility of gas in solid mainly depends on gas pressure and ambient temperature, according to Fick's law, when concentration of the gas is greater, amount of gas molecules diffused into the solid is more. As such, the passivation effect for dangling bonds or other defects of the semiconductor device is better.

In some embodiments, pressure of the second chamber is 1 atm to 100 atm. In some embodiments, the pressure of the first chamber 112 is greater than or equal to the pressure of the second chamber 114. Due to pressure difference between the first chamber 112 and the second chamber 114, the pressure difference can drive the free radicals produced by discharge ionization moving to the second chamber 114, and leading the free radicals collide with the semiconductor device 102 more efficiently.

In some embodiments, the passivation equipment 100 further includes a heating apparatus 160 and a supporting unit 170. The heating apparatus 160 and the supporting unit 170 are both disposed in the second chamber 114, in which the supporting unit 170 is configured to place the semiconductor device 102, while the heating apparatus 160 is disposed under the supporting unit 170 to heat the semiconductor device 102. In some embodiments, the semiconductor device 102 is laid flat on the supporting unit 170; thus, the semiconductor device 102 can have greater surface area near the heating apparatus 160. The conventional passivation reaction of the semiconductor device is performed at high temperature, such as greater than 600° C., but the passivation equipment 100 of the present invention can decrease the temperature of the passivation process by high pressure plasma and high reactivity of the free radical gas. In some embodiments, the heating apparatus 160 heat the semiconductor device to about 100° C. to about 600° C. Moreover, since the solubility of the gas in the solid material is influenced by temperature, the heating apparatus 160 is needed to heat the semiconductor device 102 homogeneously to ensure that various region of the semiconductor device 102 has consistent amount of the soluble gas. In some embodiments, a maximum temperature difference within the whole semiconductor device 102 is not greater than 5° C.

In some embodiments, the passivation equipment 100 can optionally include a second intake tube 145. In the embodiment shown in FIG. 1, the second intake tube 145 connected to both the first chamber 112 and the second chamber 114, but in other embodiments, the second intake tube 145 can be only connected to the first chamber 112 or the second chamber 114. The second intake tube 145 is configured to insert an inert gas to decrease usage amount of the reacting gas, especially when the reacting gas is flammable gas or other hazardous gas, such as hydrogen gas, the concentration of the reacting gas can be decreased by inserting the inert gas to decrease process hazard. Moreover, the inert gas can maintain the concentration of the free radical gases. In some embodiments, the inert gas includes one or more of helium, neon, argon, krypton and xenon.

In some embodiments, the passivation equipment 100 further includes an exhaust pipe 180 connected to the second chamber 114 to exhaust gases in the second chamber 114 when the pressure is too great or the passivation reaction ends. It is noted that compared to relative position of the first intake tube 140 and the plasma producing unit 130, the exhaust pipe 180 is disposed farther away from the plasma producing unit 130.

Figure 2:
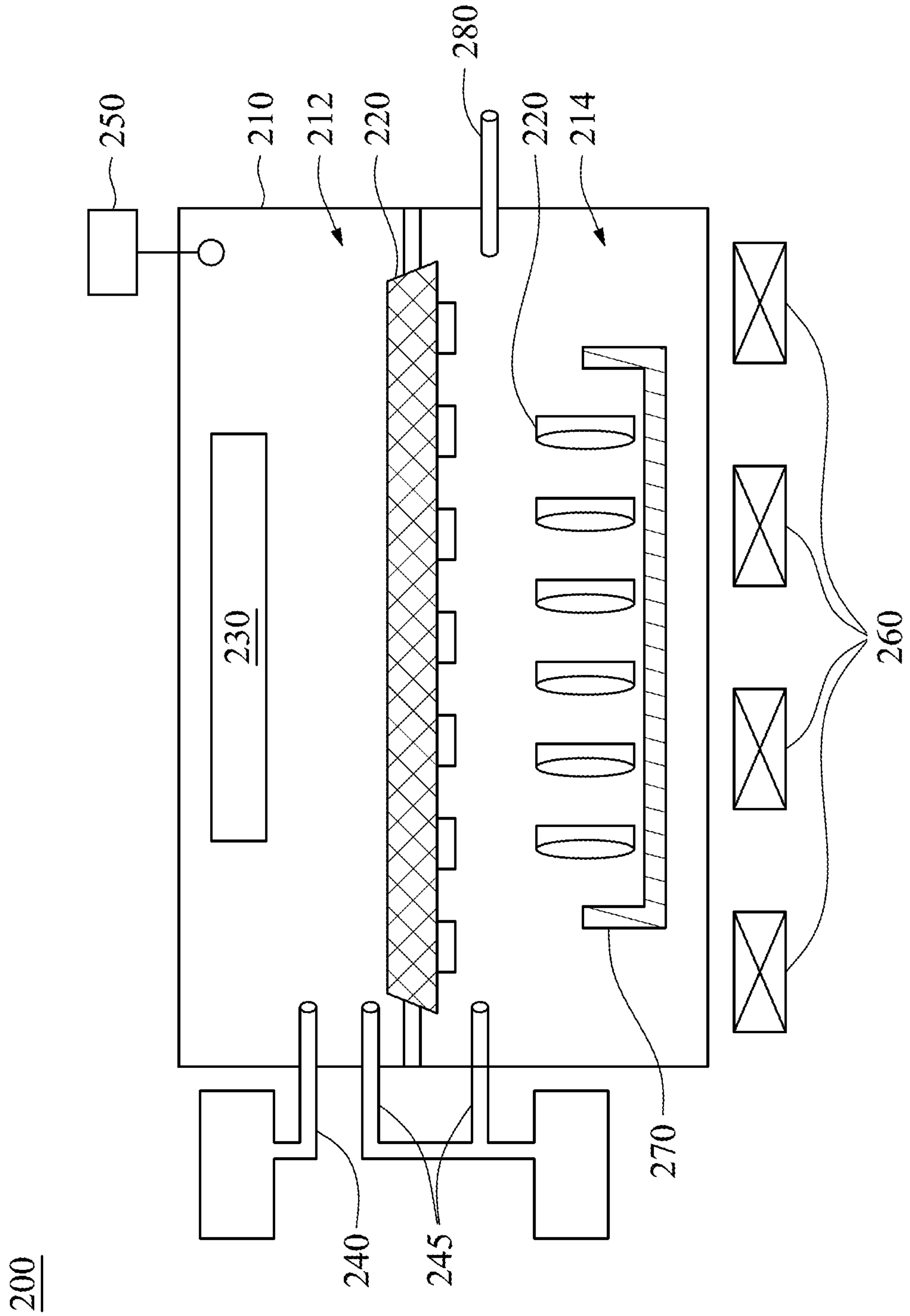
FIG. 2 illustrates a schematic diagram of a passivation equipment for a semiconductor device according to other embodiments of the present invention.

Referring to FIG. 2, FIG. 2 illustrates a schematic diagram of a passivation equipment 200 for a semiconductor device according to other embodiments of the present invention. The passivation equipment 200 is similar to the passivation equipment 100. That is, the passivation equipment 200 includes a chamber housing 210, a splitter 220, a plasma producing unit 230, a first intake tube 240, a pressure detecting unit 250 and an exhaust pipe 280. The splitter 220 divides a chamber to a first chamber 212 and a second chamber 214. In some embodiments, as shown in FIG. 2, the first chamber 212 is located over the second chamber 214. In other embodiments, the first chamber 212 is located beside the second chamber 214. In some embodiments, the passivation equipment 200 can optionally include a second intake tube 245.

The main difference between the passivation equipment 200 and the passivation equipment 100, the passivation equipment 200 further includes plural heating apparatus 260 and a carrying component 270. The carrying component 270 can be used to transport and place plural semiconductor devices 202. In some embodiments, the semiconductor devices 202 are upstanding and disposed in the carrying component 270 in parallel with each other; thus, more semiconductor devices 202 can be disposed in the carrying component 270. In some embodiments, the heating apparatus 260 is disposed outside the chamber housing 210, for example, under the second chamber 214; hence the heating apparatus 260 can heat plural semiconductor devices 202 homogeneously. In some embodiments, a maximum temperature difference between the plural semiconductor devices 202 and the carrying component 270 is not greater than 10° C. Since the plural semiconductor devices 202 can be disposed in the carrying component 270, the passivation reaction for the semiconductor devices 202 can be performed more efficiently.

Figure 3B:
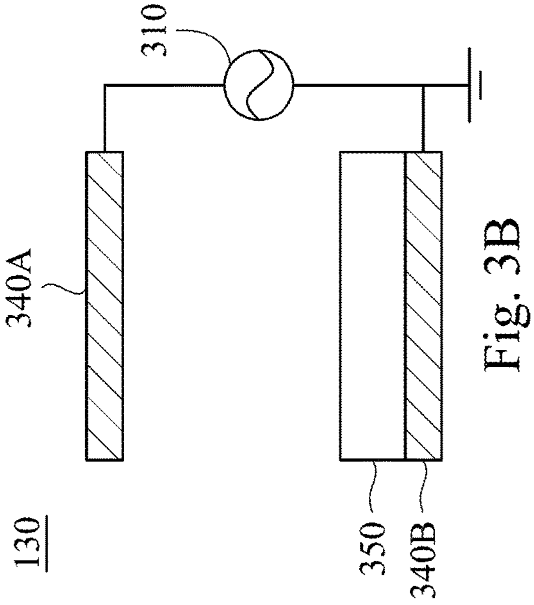
FIGS. 3A-3C illustrate configuration diagram of plasma producing units according to some embodiments of the present invention.
Figure 3A:
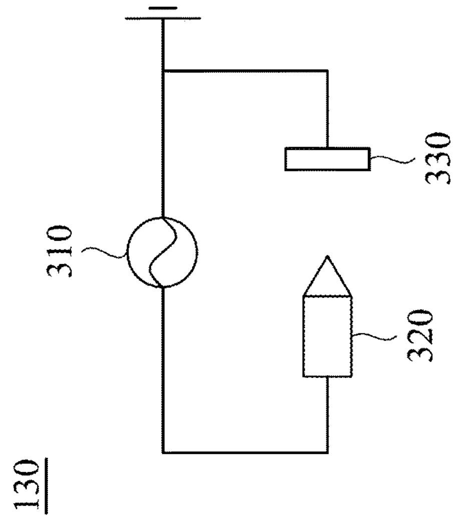
Figure 3C:
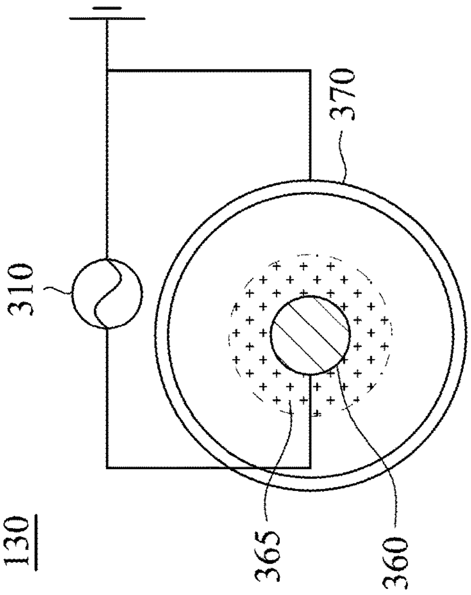

In some embodiments, plasma producing methods of the plasma producing unit 130 (or the plasma producing unit 230) includes corona discharge or dielectric barrier discharge. FIGS. 3A-3C illustrate configuration diagram of the plasma producing unit 130 (or the plasma producing unit 230) according to some embodiments of the present invention. Referring to FIG. 3A, in some embodiments using the corona discharge, the plasma producing unit 130 includes a needle electrode 320 and a plate electrode 330 and applies voltage by high-frequency pulse voltage source 310. It uses tip of the electrode with small radius of curvature to produce electric field with partial greater intensity; thus ionization reaction occurs on the gas molecules to produce high-pressure plasma.

Referring to FIG. 3B, in some embodiments, using dielectric barrier discharge, the plasma producing unit 130 includes a plate electrode 340A and a plate electrode 340B, in which the plate electrode 340B includes a dielectric barrier plate 350 disposed thereon. In other embodiments, material of the dielectric barrier plate 350 can be glass, quartz or ceramic. By applying voltage through high-frequency pulse voltage source 310, the reacting gas molecules are enormously increased due to inelastic collision of ions. When electron density in the space is greater than a critical value, microdischarge is produced between the two electrodes. Therefore, the plasma is produced between the plate electrode 340A and the dielectric barrier plate 350 or between two dielectric barrier plates.

Referring to FIG. 3C, in some embodiments using the corona discharge, the plasma producing unit 130 includes a pillar electrode 360 and a ring electrode 370 surrounded the pillar electrode 360, and a voltage is applied by high-frequency pulse voltage source 310 to cause great voltage difference between the pillar electrode 360 and the ring electrode 370. Hence, reacting gas molecules around the pillar electrode 360 lead to the corona discharge because the great electric field ionizes the gas molecules, thereby producing high-pressure plasma. In some examples, the pillar electrode 360 includes a nano-tip emission layer 365. In some embodiments, the nano-tip emission layer 365 can be composed of nano carbon tube, nano metal line or other nanostructure material layer with excellent conductivity. Due to small size of the nanostructure, the tip electric field of the nanostructure becomes relatively great, thereby causing very high electric field enhancement; hence a field emission initial voltage decreases enormously, and electric emission ability becomes great.

Subsequently, the passivation equipment 100 (or passivation equipment 200) can be used to perform the passivation for the semiconductor devices. The following discussion takes the passivation equipment 100 as an example. Referring again to FIG. 1, first, one semiconductor device 102 is disposed on the supporting unit 170 in the second chamber 114 of the passivation equipment 100. Subsequently, the reacting gas is inserted to the first chamber 112 through the first intake tube 140 such that the gas pressure of the first chamber 112 reaches a predetermined pressure value. In some embodiments, the reacting gas includes one or more of hydrogen gas ($H_2$), nitrogen gas ($N_2$), amine gas ($NH_3$), oxygen gas ($O_2$), water, hydrogen sulfide ($H_2S$), dinitrogen monoxide ($N_2O$), nitrogen dioxide ($NO_2$), phosphine ($PH_3$), arsine ($AsH_3$) and deuterium gas ($D_2$). In some embodiments, the predetermined pressure value is not smaller than 1 atm, about 1 atm to about 100 atm is preferable, and greater than 1 atm to about 100 atm is more preferable.

In some embodiments, when the reacting gas is inserted (or after inserting the reacting gas), the inert gas can be optionally inserted into the first chamber 112 and/or the second chamber 114 through the second intake tube 145, thereby decreasing process hazard and maintain the concentration of the free radical gases. In such embodiment, the inert gas includes one or more of helium, neon, argon, krypton and xenon.

In some embodiments, the heating apparatus 160 is then used to heat the semiconductor device 102 to heat the semiconductor device 102 to about 100° C. to 600° C. It is understood that the heating temperature can be modified according to different semiconductor device, but the heating temperature of the present invention is lower than the conventional temperature of performing repairing operation or the passivation reaction to various semiconductor devices.

Subsequently, the plasma producing unit 130 is turned on to perform discharge ionization reaction to the reacting gas in the first chamber 112, thereby producing the plasma gas. Then, the plasma gas flows into the second chamber 114 through the splitter 120, and performs the passivation reaction with the semiconductor device 102. After time for performing the passivation reaction reaches a predetermined treatment time, the plasma producing unit 130 is turned off, and the remaining gas in the second chamber 114 is exhausted through the exhaust pipe 180. In some embodiments, the predetermined treatment time is about 300 seconds to about 30 minutes. Compared to the conventional methods, which can consume about 1 hour to about 3 hours, the method of the present invention can shorten treatment time efficiently. Since the present invention uses the high-pressure plasma to perform repairing process for the semiconductor device, the concentration of the plasma gas is greater, efficiency of the passivation reaction is better, so the predetermined treatment time is shorter than that of the conventional method.

In some embodiments, before turning on the plasma producing unit 130, the voltage source (such as the high-frequency pulse voltage source 310) should apply an AC voltage to the plasma producing unit 130, and the frequency of the AC voltage is lower than 13.6 MHz.

The following embodiments are provided to better elucidate the practice of the present invention and should not be interpreted in anyway as to limit the scope of same. Those skilled in the art will recognize that various modifications can be made while not departing from the spirit and scope of the invention.

Figure 4:
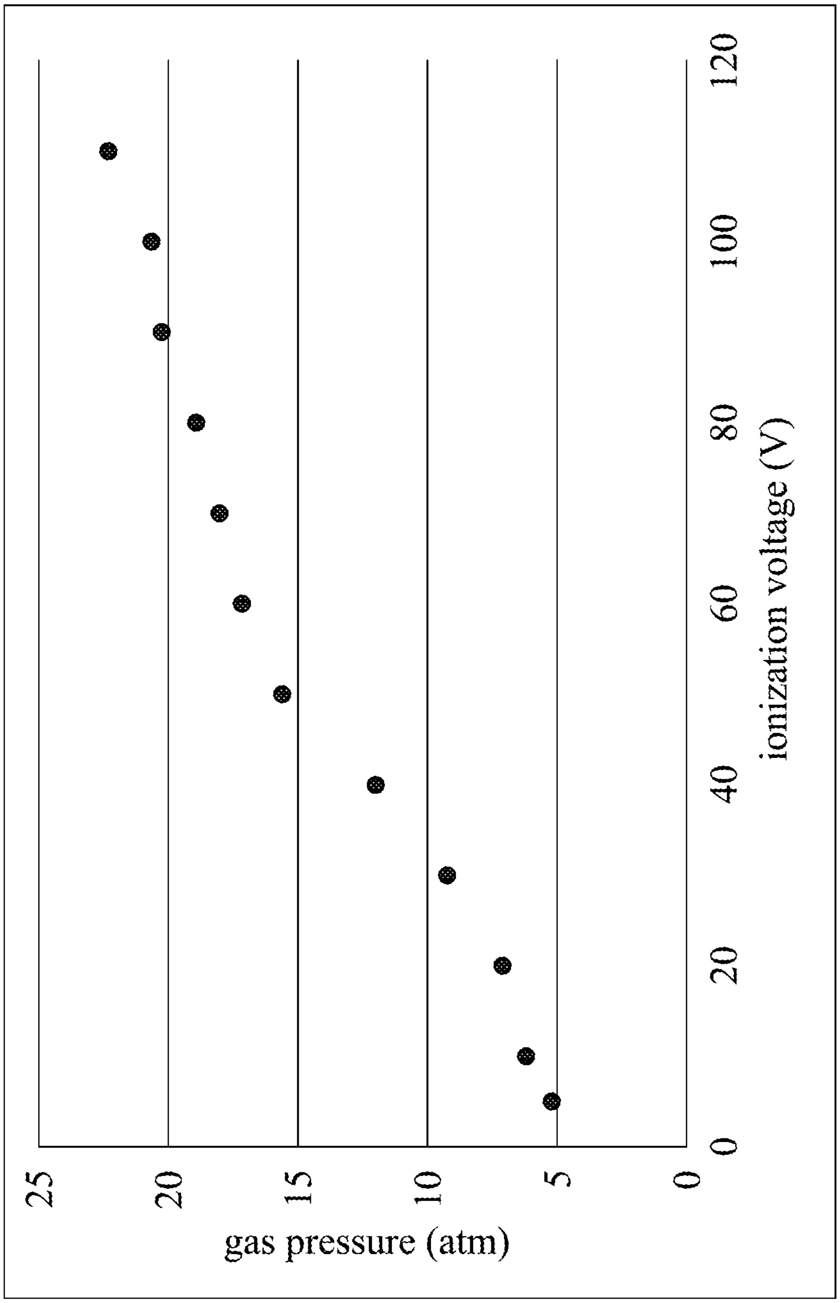
FIG. 4 is ionization voltage values under different reacting gas pressure in a passivation equipment for a semiconductor device of the present invention.

Referring to FIG. 4, FIG. 4 illustrates ionization voltage values under different reacting gas pressure in a passivation equipment for a semiconductor device of the present invention, in which the plasma producing unit is the plasma producing unit 130 as shown in FIG. 3, that is, the one including the needle electrode 320 and the plate electrode 330. It is noted that the ionization voltage value represents that the reacting gas molecules can be ionized and become conductive after such voltage is exceeded. In other words, the plasma gases can be produced in the aforementioned condition. As shown in FIG. 4, the pressure of the reacting gas is about 5 atm to about 25 atm, and the gas molecules can be ionized under the specific voltage to produce the plasma gas. That is, the passivation equipment for the semiconductor device of the present invention can indeed produce high-pressure plasma under the pressure not smaller than 1 atm.

According to above embodiments, the present invention provides the passivation equipment and the passivation method for the semiconductor device, which uses the high-pressure plasma to increase the concentration of free radicals for passivation of the semiconductor device. Therefore, the temperature of repairing material defects of the semiconductor devices is decreased, and efficiency of repairing and passivation for the semiconductor device can be increased.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A passivation equipment for a semiconductor device, comprising:

a chamber housing;

a splitter, disposed inside the chamber housing, wherein the splitter divides the chamber housing into a first chamber and a second chamber, and the second chamber is configured to accommodate at least a semiconductor device;

a first intake tube, connected to the first chamber, wherein the first intake tube is configured to insert a reacting gas;

a plasma producing unit, disposed in the first chamber; and a pressure detecting unit, connected to the first chamber, wherein the pressure detecting unit is configured to detect a pressure of the first chamber, and the pressure is not smaller than 1 atm, wherein the plasma producing unit uses a dielectric barrier plasma source, and the plasma producing unit comprises a high frequency pulse voltage source and two plate electrodes, wherein at least one of the plate electrodes comprises a dielectric barrier plate.

2. The passivation equipment for the semiconductor device of claim 1, further comprising:

a supporting unit, disposed in the second chamber, wherein the supporting unit is configured to place the at least a semiconductor device; and a heating apparatus, disposed in the second chamber and under the supporting unit, wherein the heating apparatus is configured to heat the at least a semiconductor device.

3. The passivation equipment for the semiconductor device of claim 1, further comprising:

a carrying component, disposed in the second chamber, wherein the carrying component is configured to transport and place the at least a semiconductor device; and a plurality of heating apparatus, disposed out of the chamber housing, wherein the plurality of heating apparatus are configured to heat the at least a semiconductor device.

4. The passivation equipment for the semiconductor device of claim 1, wherein the plasma producing unit uses a corona plasma source, and the plasma producing unit comprises a high frequency pulse voltage source, a needle electrode and a plate electrode.

5. The passivation equipment for the semiconductor device of claim 1, wherein the plasma producing unit uses a corona plasma source, and the plasma producing unit comprises a high frequency pulse voltage source, a pillar electrode and a ring electrode.

6. The passivation equipment for the semiconductor device of claim 1, further comprising:

a second intake tube, connected to the first chamber and/or the second chamber, wherein the second intake tube is configured to insert an inert gas.

7. The passivation equipment for the semiconductor device of claim 1, further comprising:

an exhaust pipe, connected to the second chamber, wherein the exhaust pipe is configured to exhaust the reacting gas.

8. A passivation method for a semiconductor device, comprising:

providing a passivation equipment, wherein the passivation equipment comprises:

a chamber housing;

a splitter, disposed in the chamber housing, wherein the splitter divides the chamber housing into a first chamber and a second chamber;

a plasma producing unit, disposed in the first chamber;

a first intake tube, connected to the first chamber; and a pressure detecting unit, connected to the first chamber;

placing at least a semiconductor device in the second chamber;

inserting a reacting gas into the first chamber by the first intake tube to make a pressure of the first chamber not smaller than 1 atm;

turning on the plasma producing unit to produce a high-pressure plasma; and performing a passivating operation, wherein the passivating operation comprises flowing the high-pressure plasma to the second chamber through the splitter and reacting with the at least a semiconductor device, wherein the plasma producing unit uses a dielectric barrier plasma source, and the plasma producing unit comprises a high frequency pulse voltage source and two plate electrodes, wherein at least one of the plate electrodes comprises a dielectric barrier plate.

9. The passivation method for the semiconductor device of claim 8, wherein the reacting gas comprises one or more of hydrogen gas ($H_2$), nitrogen gas ($N_2$), amine gas ($NH_3$), oxygen gas ($O_2$), water, hydrogen sulfide ($H_2S$), dinitrogen monoxide ($N_2O$), nitrogen dioxide ($NO_2$), phosphine ($PH_3$), arsine ($AsH_3$) and deuterium gas ($D_2$).

10. The passivation method for the semiconductor device of claim 8, wherein when inserting the reacting gas, the method further comprises:

inserting an inert gas to the first chamber and/or the second chamber, wherein the inert gas comprises one or more of helium, neon, argon, krypton and xenon.

11. The passivation method for the semiconductor device of claim 8, further comprises:

before turning on the plasma producing unit, heating the at least a semiconductor device to 100° C. to 600° C.

12. The passivation method for the semiconductor device of claim 8, wherein the pressure of the first chamber is 1 atm to 100 atm.

13. The passivation method for the semiconductor device of claim 8, wherein the pressure of the first chamber is greater than or equal to a pressure of the second chamber.

14. The passivation method for the semiconductor device of claim 8, further comprising:

before turning on the plasma producing unit, applying an AC voltage to the plasma producing unit, wherein a frequency of the AC voltage is lower than 13.6 MHz.

15. A passivation equipment for a semiconductor device, comprising:

a chamber housing;

a splitter, disposed inside the chamber housing, wherein the splitter divides the chamber housing into a first chamber and a second chamber, a pressure of the first chamber is greater than or equal to 1 atm, and the second chamber is configured to accommodate at least a semiconductor device;

a first intake tube, connected to the first chamber, wherein the first intake tube is configured to insert a reacting gas;

a second intake tube, connected to the first chamber and the second chamber, wherein the second intake tube is configured to insert an inert gas;

a plasma producing unit, disposed in the first chamber; and an exhaust pipe, connected to the second chamber, wherein the exhaust pipe is configured to exhaust the reacting gas, wherein the plasma producing unit uses a dielectric barrier plasma source, and the plasma producing unit comprises a high frequency pulse voltage source and two plate electrodes, wherein at least one of the plate electrodes comprises a dielectric barrier plate.

16. The passivation equipment for the semiconductor device of claim 15, further comprising:

a supporting unit, disposed in the second chamber, wherein the supporting unit is configured to place the at least a semiconductor device; and a heating apparatus, disposed in the second chamber and under the supporting unit, wherein the heating apparatus is configured to heat the at least a semiconductor device.

17. The passivation equipment for the semiconductor device of claim 15, further comprising:

a carrying component, disposed in the second chamber, wherein the carrying component is configured to transport and place the at least a semiconductor device; and a plurality of heating apparatus, disposed out of the chamber housing, wherein the plurality of heating apparatus are configured to heat the at least a semiconductor device.

18. The passivation equipment for the semiconductor device of claim 15, further comprising:

a pressure detecting unit, connected to the first chamber, wherein the pressure detecting unit is configured to detect a pressure of the first chamber.

19. The passivation equipment for the semiconductor device of claim 15, wherein the plasma producing unit uses a dielectric barrier plasma source or a corona plasma source.

* * * * *